US011894228B2

(12) United States Patent
Rathi et al.

(10) Patent No.: US 11,894,228 B2
(45) Date of Patent: Feb. 6, 2024

(54) TREATMENTS FOR CONTROLLING DEPOSITION DEFECTS

(71) Applicant: Applied Materials, Inc., Santa Clara, CA (US)

(72) Inventors: Sudha S. Rathi, San Jose, CA (US); Ganesh Balasubramanian, Fremont, CA (US); Nagarajan Rajagopalan, San Jose, CA (US); Abdul Aziz Khaja, San Jose, CA (US); Prashanthi Para, Santa Clara, CA (US); Hiral D. Tailor, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 274 days.

(21) Appl. No.: 17/412,721

(22) Filed: Aug. 26, 2021

(65) Prior Publication Data

US 2023/0061249 A1    Mar. 2, 2023

(51) Int. Cl.
*H01L 21/02* (2006.01)
*H01J 37/32* (2006.01)
*C23C 16/50* (2006.01)

(52) U.S. Cl.
CPC ........ *H01L 21/02274* (2013.01); *C23C 16/50* (2013.01); *H01J 37/32357* (2013.01); *H01J 37/32449* (2013.01); *H01L 21/02115* (2013.01); *H01J 2237/332* (2013.01)

(58) Field of Classification Search
CPC . H01L 21/02274; H01L 21/0226–0228; H01L 21/02112–02115; H01L 21/02126; C23C 16/50; C23C 16/26; C23C 16/452; H01J 37/32357; H01J 37/32449; H01J 2237/32–332

USPC .......................................................... 438/778
See application file for complete search history.

(56) References Cited

U.S. PATENT DOCUMENTS

| | | |
|---|---|---|
| 2005/0282328 A1 | 12/2005 | Sandhu et al. |
| 2011/0053380 A1* | 3/2011 | Sapre .................. H01L 21/3065 438/715 |
| 2016/0222522 A1 | 8/2016 | Wang et al. |
| 2017/0018439 A1 | 1/2017 | Wang et al. |
| 2018/0019387 A1 | 1/2018 | Tan et al. |
| 2018/0138075 A1* | 5/2018 | Kang .................. H01L 21/7682 |

(Continued)

OTHER PUBLICATIONS

International Search Report and Written Opinion dated Dec. 9, 2022 in International Patent Application No. PCT/US2022/041091, 9 pages.

*Primary Examiner* — Marcos D. Pizarro
*Assistant Examiner* — Li-Chun Tung
(74) *Attorney, Agent, or Firm* — Kilpatrick Townsend & Stockton LLP

(57) ABSTRACT

Exemplary methods of semiconductor processing may include forming a plasma of a carbon-containing precursor in a processing region of a semiconductor processing chamber. The methods may include depositing a carbon-containing material on a substrate housed in the processing region of the semiconductor processing chamber. The methods may include halting a flow of the carbon-containing precursor into the processing region of the semiconductor processing chamber. The methods may include contacting the carbon-containing material with plasma effluents of an oxidizing material. The methods may include forming volatile materials from a surface of the carbon-containing material.

20 Claims, 2 Drawing Sheets

(56) References Cited

U.S. PATENT DOCUMENTS

| | | | |
|---|---|---|---|
| 2020/0257196 A1 | 8/2020 | Meyers et al. | |
| 2021/0335603 A1* | 10/2021 | Gurjar | C23C 16/452 |
| 2022/0165567 A1* | 5/2022 | Khaja | H01J 37/32715 |
| 2022/0216058 A1* | 7/2022 | Wang | H01L 21/0262 |
| 2022/0359214 A1* | 11/2022 | Wang | H10B 43/35 |
| 2022/0364227 A1* | 11/2022 | Zhou | C23C 16/45557 |
| 2022/0384161 A1* | 12/2022 | Bobek | C23C 14/564 |
| 2023/0015080 A1* | 1/2023 | Wang | H01L 21/31122 |

* cited by examiner

TREATMENTS FOR CONTROLLING DEPOSITION DEFECTS

TECHNICAL FIELD

The present technology relates to semiconductor processing methods. More specifically, the present technology relates to methods of treating substrates and deposited materials to reduce defect formation.

BACKGROUND

Integrated circuits are made possible by processes which produce intricately patterned material layers on substrate surfaces. Producing patterned material on a substrate requires controlled methods for forming and removing material. As device sizes continue to reduce, defects along deposited films may have a more detrimental effect. To limit defect formation and deposition, improved control of deposition parameters and chamber cleanings may be performed. However, these processes may be incapable or limiting defects at sufficiently small dimensions, which can still impact device performance.

Thus, there is a need for improved systems and methods that can be used to produce high quality devices and structures. These and other needs are addressed by the present technology.

SUMMARY

Exemplary methods of semiconductor processing may include forming a plasma of a carbon-containing precursor in a processing region of a semiconductor processing chamber. The methods may include depositing a carbon-containing material on a substrate housed in the processing region of the semiconductor processing chamber. The methods may include halting a flow of the carbon-containing precursor into the processing region of the semiconductor processing chamber. The methods may include contacting the carbon-containing material with plasma effluents of an oxidizing material. The methods may include forming volatile materials from a surface of the carbon-containing material.

In some embodiments, the oxidizing material may be or include an oxygen-containing precursor or a fluorine-containing precursor. The plasma effluents of the oxidizing material may be formed in the processing region of the semiconductor processing chamber. The plasma effluents may be generated at a plasma power of less than or about 200 W. The plasma effluents of the oxidizing material may be formed in a remote plasma unit fluidly coupled with the processing region of the semiconductor processing chamber. A temperature of the semiconductor processing chamber may be maintained at greater than or about 400° C. during the method. Contacting the carbon-containing material with plasma effluents of the oxidizing material may cause a surface of the carbon-containing material to become negatively charged. Contacting the carbon-containing material with plasma effluents of the oxidizing material may be performed for less than or about 30 seconds. Contacting the carbon-containing material with plasma effluents of the oxidizing material may be performed in the semiconductor processing chamber directly subsequent to the carbon-containing material being deposited on the substrate. A carrier gas may be flowed with the carbon-containing precursor. A flow of the carrier gas may be maintained while contacting the carbon-containing material with plasma effluents of the oxidizing material. A plasma may be sustained between depositing the carbon-containing material and contacting the carbon-containing material with plasma effluents of the oxidizing material.

Some embodiments of the present technology may encompass methods of semiconductor processing. The methods may include forming a plasma of one or more deposition precursors in a processing region of a semiconductor processing chamber. The methods may include depositing a material on a substrate housed in the processing region of the semiconductor processing chamber. The methods may include halting a flow of at least one of the one or more deposition precursors into the processing region of the semiconductor processing chamber. The methods may include contacting the material deposited on the substrate with plasma effluents of an oxidizing material. The methods may include forming volatile materials from a surface of the material deposited on the substrate.

In some embodiments, the material deposited on the substrate may include one or more of amorphous carbon, doped carbon, or a silicon-containing material. The oxidizing material may be or include an oxygen-containing precursor or a fluorine-containing precursor. The plasma effluents of the oxidizing material may be formed in the processing region of the semiconductor processing chamber. The plasma effluents may be generated at a plasma power of less than or about 500 W. Contacting the material deposited on the substrate with plasma effluents of the oxidizing material may cause a surface of the material deposited on the substrate to become negatively charged. Contacting the material deposited on the substrate with plasma effluents of the oxidizing material may be performed for less than or about 30 seconds. A carrier gas may be included as one of the one or more deposition precursors. A flow of the carrier gas may be maintained while contacting the material deposited on the substrate with plasma effluents of the oxidizing material. A plasma may be sustained between depositing the material on the substrate and contacting the material with plasma effluents of the oxidizing material.

Some embodiments of the present technology may encompass methods of semiconductor processing. The methods may include forming a plasma of a carbon-containing precursor in a processing region of a semiconductor processing chamber. The methods may include depositing a carbon-containing material on a substrate housed in the processing region of the semiconductor processing chamber. The methods may include halting a flow of the carbon-containing precursor into the processing region of the semiconductor processing chamber. The methods may include contacting the carbon-containing material with an oxidizing material in the semiconductor processing chamber. The methods may include treating a surface of the carbon-containing material.

In some embodiments, treating the surface of the carbon-containing material may include forming a plasma of the oxidizing material in the processing region of the semiconductor processing chamber. Treating the surface of the carbon-containing material may include contacting the carbon-containing material with plasma effluents of the oxidizing material. Treating the surface of the carbon-containing material may include forming volatile materials from a surface of the carbon-containing material.

Such technology may provide numerous benefits over conventional systems and techniques. For example, the processes may reduce defect formation on processed substrates, which can otherwise lead to inline defects. Additionally, the operations of embodiments of the present technology may improve adhesion of subsequently deposited materials, by controlling the surface hydrophobicity or hydrophilicity of deposited materials. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
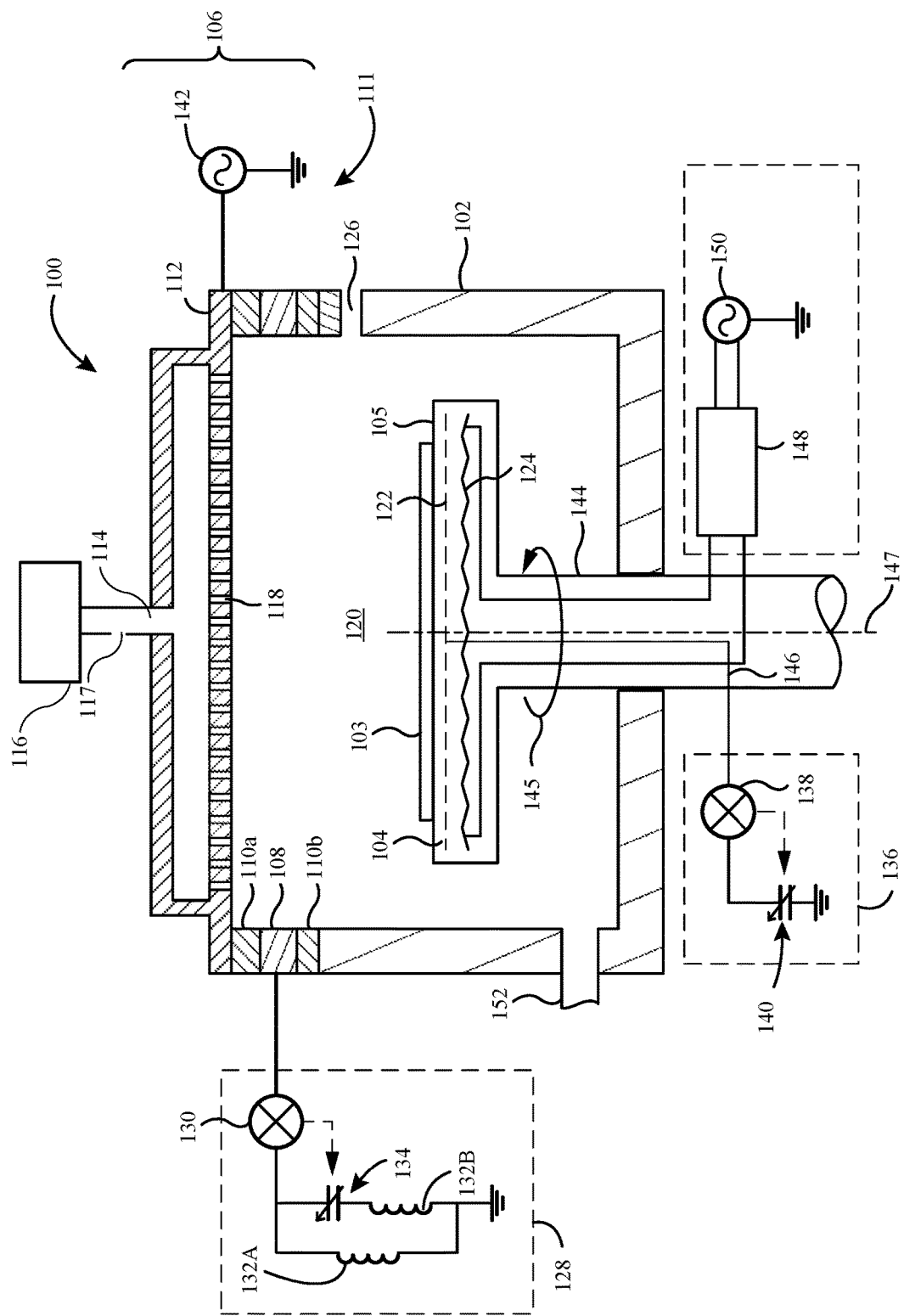
FIG. 1 shows a schematic cross-sectional view of an exemplary processing chamber according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Deposition operations in semiconductor processing may be included to form any number of materials on a substrate. For example, materials may be deposited on a substrate to produce semiconductor structures, as well as to facilitate patterning or removal of materials on a substrate. As one non-limiting example, hardmasks may be deposited on substrates to facilitate removal or patterning of materials on a substrate. The hardmask deposition may be performed in any number of ways, including by thermally-activated deposition as well as plasma-enhanced deposition. Regardless of the mechanism, many deposition operations deposit materials not only on the substrate being processed, but on chamber components as well. For example, in a processing region, deposition may occur on a substrate as well as a pedestal or support on which the substrate is seated, faceplates or diffusers that may distribute materials into the processing region, chamber walls defining the processing region, and components defining exhaust pathways for materials and byproducts subsequent to deposition.

Once the deposition process is completed, the substrate may be removed from the processing region, and the chamber may be cleaned for the next wafer to be processed. However, aspects of the deposition process and/or the cleaning process may impact formation of defects on the substrate. For example, during deposition, materials may deposit not only on the substrate, but on a variety of chamber surfaces within the processing region. Once deposition has been completed, some deposition materials may fall back onto the substrate causing defects on the film formed. Similarly, after a cleaning process has been completed and a new substrate is delivered into the processing chamber, residual materials may still remain on surfaces of the processing region, which may fall to the substrate, and impact the deposition operation to be performed.

Although large defects can be relatively well controlled with subsequent metrology operations that can identify and address defect formation, many defects may be too small to be identified using a variety of current metrology methods. For example, defects that are less than or about 20 nm, may remain on the deposited film. These defects may have less impact on historically larger features, but on features with reduced critical dimensions, these defects may cause challenges, such as misalignment of subsequent feature formation in reduced scaling. For example, during subsequent processing, such as with a lithography operation performed on a mask, the defects may alter the pattern formation, which can produce inline defects impacting subsequent processing, and leading to device damage or scrapping.

The present technology may overcome these limitations by performing a treatment before and/or after the deposition, which may remove defects deposited on the substrate. By contacting the materials with an oxidizing material, many defect particles may be volatized and exhausted from the chamber. After describing general aspects of a chamber according to embodiments of the present technology in which plasma processing operations discussed below may be performed, specific processes and operations according to embodiments of the present technology will be described. It is to be understood that the present technology is not intended to be limited to the specific chambers or processing discussed, as the techniques described may be used to improve a number of processes, and may be applicable to a variety of processing chambers and operations.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Inlet 114 may include delivery from a remote plasma source unit 116, which may be fluidly coupled with the chamber, as well as a bypass 117 for process gas delivery that may not flow through the remote plasma source unit 116 in some embodiments. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
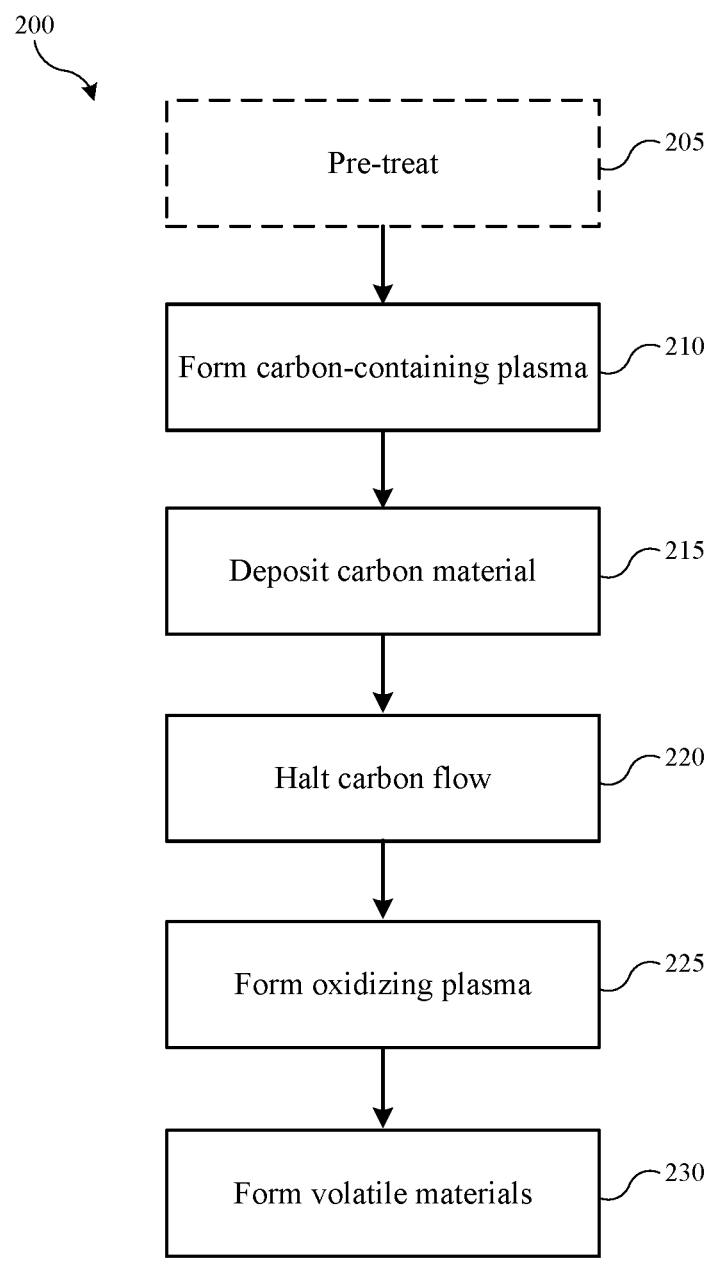
FIG. 2 shows exemplary operations in a deposition method according to some embodiments of the present technology.

Turning to FIG. 2 is shown exemplary operations in a processing method 200 according to some embodiments of the present technology. The method may be performed in a variety of processing chambers, including processing chamber 100 described above, as well as any other chambers in which the operations may be performed. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may include a processing method that may include a number of operations for reducing surface defects on substrates or materials deposited on substrates. As will be explained further below, by adjusting the surface energy and/or superficially etching exposed material on a substrate, defects can be limited or prevented, which can improve downstream processes including lithography.

In some embodiments, method 200 may optionally include a pre-treatment of a substrate surface at optional operation 205. By pre-treating the surface of the substrate, adhesion of the film may be improved by producing favorable termination between the substrate and the film. Additionally, any materials that may have dropped to the substrate may be purged or removed prior to film deposition. The pre-treatment may be or include a thermal process, or may include a plasma-enhanced process. Processing conditions or materials may be similar to any processing condition or material discussed below, which may be used during deposition or treatment occurring subsequent to deposition. The treatment may include delivery of a hydrogen-containing precursor, a nitrogen-containing precursor, an oxidizing precursor as will be described below, or some other precursor. Exemplary precursors may include hydrogen, ammonia, or other hydrogen-containing or nitrogen-containing precursors, or any oxidizing precursor that may interact with the substrate or defect materials as will be described further below. For example, in some embodiments the pre-treatment may include some or all operations as will be discussed below as occurring subsequent to deposition of a film according to embodiments of the present technology.

At operation 210, the method may include forming a plasma of a carbon-containing precursor in the processing region of the semiconductor processing chamber. At operation 215, a carbon-containing material may be deposited on the substrate, which may be seated on a substrate support within the processing region, such as previously described. Although the remaining disclosure will discuss carbon-containing materials, it is to be understood that some embodiments of the present technology may be applicable to a number of additional materials and films, including additional film formations. For example, although a plasma-enhanced deposition is discussed, thermally deposited carbon-containing films may also beneficially be treated by aspects of the present technology. Similarly, other materials that may be used in embodiments of the present technology may include silicon-containing materials, doped materials, including doped carbon and/or doped silicon, and a number of additional mask or deposition products, as one of skill would readily appreciate could be incorporated in some embodiments of the present technology.

The plasma power at which the processing is performed may impact the film growth, as well as a variety of properties of the film. For example, carbon incorporation within the film may allow the dielectric constant to be reduced by incorporating additional methyl groups within the film. However, during plasma processing, methyl moieties may be decomposed relatively easily, and carbon may then simply be exhausted from the chamber. Additionally, as plasma power increases, bombardment of the film may increase, which may remove pores and densify the film, and which may further reduce the film dielectric constant. Accordingly, in some embodiments, the plasma may be generated at a plasma power of less than or about 500 W, and may be generated at less than or about 450 W, less than or about 400 W, less than or about 350 W, less than or about 300 W, less than or about 250 W, less than or about 200 W, less than or about 150 W, less than or about 100 W, less than or about 50 W, or less.

Similarly, the pressure at which the process may be performed may impact aspects of the process as well. For example, as pressure increases, absorption of atmospheric water may increase, which may increase the dielectric constant of the film. As pressure is maintained lower, hydrophobicity of the film may increase. Accordingly, in some embodiments the pressure may be maintained at less than or about 10 Torr to afford production of sufficiently low dielectric constant, and the pressure may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.5 Torr, or less. However, to maintain plasma parameters to facilitate film formation, the pressure may be maintained above or about 0.5 Torr, and may be maintained above or about 1 Torr, or higher.

At operation 220, once sufficient deposition has occurred, flow of the carbon-containing precursor, as well as any number of other deposition precursors, may be halted. In some embodiments, the plasma may be extinguished, if used, and a purge operation may then proceed in the same processing chamber in which the deposition has occurred. Additionally, in some embodiments, the plasma may be maintained during the transition to the purge, or subsequently reignited, which may allow deposition materials to be better purged from the system. For example, in some embodiments a plasma may be generated from an oxidizing precursor at operation 225. The plasma may be generated in a remote plasma unit as previously described, or may be generated within the processing region, or maintained within the processing region subsequent the deposition. As one non-limiting example for a carbon-containing material, the deposition precursors may include one or more carrier gases, such as argon and/or helium. In some embodiments, when delivery of the carbon-containing precursor is halted, delivery of the carrier gases may be at least partially maintained in order to maintain the plasma. Additionally, the oxidizing material may be delivered simultaneously with halting flow of the carbon-containing precursor, which may also facilitate maintaining the plasma generation.

The plasma effluents of the oxidizing material may contact the carbon-containing material and form volatile materials from an exposed surface of the carbon-containing material at operation 230. Additionally, any residual carbon-containing material that may have been trapped or held within the plasma envelope, especially small defect materials that may not be large enough to deposit from the plasma, may react with the oxidizing material. In conventional technologies, small particles may fall to the surface of the substrate as soon as the deposition plasma is extinguished, despite a flow of purge gas. This may be due to the proximity of the particles to the substrate, and length of the exhaust path, which may allow the particles to drop to the wafer, and cause defects in the formed film. Especially smaller defect particles as discussed above may contribute to sub-20 nm particle generation, as these materials may otherwise be sustained in the plasma during the deposition.

However, the oxidizing materials may react with these particles prior to falling to the substrate, which may allow volatile materials to be formed. As one non-limiting example, carbon-containing materials, such as carbon-and-hydrogen radical or effluent species, may be contacted by oxygen, fluorine, or hydrogen radicals and produce volatile gas species, which may be readily exhausted from the system. The oxidizing materials may limit the amalgamation of carbon-hydrogen fragments to larger chains, which can limit smaller gas phase nucleation defects. This has been shown to dramatically reduce defect generation on the substrate. Although in some embodiments formation of the oxidizing plasma may occur in the remote plasma region, by producing or sustaining the plasma in the processing region, the particles may be sustained within the plasma and reacted with the oxidizing materials prior to contacting the substrate.

In some embodiments, the oxidizing material may be or include an oxygen-containing material, a fluorine-containing material, and/or a hydrogen-containing material. As non-limiting examples, the oxidizing material may be or include oxygen, ozone, nitrous oxide, nitric oxide, water, an alcohol, any organo-fluorine material, which may include carbon, hydrogen, and fluorine, carbon tetrafluoride, nitrogen trifluoride, fluorine gas, or any other fluorine-containing precursor, diatomic hydrogen, ammonia, or any number of other materials that may include oxygen, fluorine, or hydrogen.

Carbon-containing precursors that may be used in deposition may be or include any number of carbon-containing precursors. For example, the carbon-containing precursor may be or include any hydrocarbon, or any material including or consisting of carbon and hydrogen. In some embodiments, the carbon-containing precursor may be characterized by one or more carbon-carbon double bonds and/or one or more carbon-carbon triple bonds. Accordingly, in some embodiments the carbon-containing precursor may be or include an alkane, alkene, or an alkyne, such as acetylene, ethylene, propene, or any other carbon-containing material. The precursor may include carbon-and-hydrogen-containing precursors, which may include any amount of carbon and hydrogen bonding, along with any other element bonding.

As explained above, some embodiments may include silicon-containing material formation. Non-limiting examples of silicon-containing precursors that may be used during processing according to some embodiments of the present technology may include silane, disilane, trisilane, silicon tetrafluoride, silicon tetrachloride, dichlorosilane, as well as any other silicon-containing precursors that may be used in silicon-containing film formation. Dopant precursors may also be used with any of the other precursors to produce doped films. As one dopant that may be included, boron-containing precursors may include borane, diborane, tetraborane, pentaborane, hexaborane, decaborane, or any other boron-containing precursors, which may provide any amount of boron incorporation in deposited films.

The temperature within the processing region, or the substrate or support temperature may be maintained at the deposition temperature, or may be increased in some embodiments. Accordingly, in embodiments of the present technology the temperature may be any temperature used in deposition operations, such as greater than or about 100° C., greater than or about 200° C., greater than or about 300° C., greater than or about 400° C., greater than or about 500° C., or higher. Pressure may be increased or decreased between the deposition operation, and may be used to control an amount of interaction with the oxidizing material and the deposited material. For example, as pressure increases, an amount of impact or interaction between the oxidizing materials and the substrate may increase, which may increase an amount of etching of the film. Similarly, at much lower pressures, mean-free path may increase, which may increase ion energy causing an amount of sputtering of the film deposited. Consequently, to control losses of the deposited material, although the pressure may be maintained at any pressure of deposition operations, in some embodiments the pressure may be maintained between about 2 Torr and about 20 Torr, and may be maintained at less than or about 15 Torr, less than or about 12 Torr, less than or about 10 Torr, less than or about 8 Torr, less than or about 5 Torr, or less than or about 3 Torr.

As noted above, the oxidizing material may enact an amount of etching of the material formed on the substrate. For example, oxygen-containing materials are often used to etch carbon films or hardmasks. To reduce or limit an amount of removal, a plasma power used when generating the plasma species of the oxidizing material may be maintained at less than or about 500 W, and may be maintained at less than or about 450 W, less than or about 400 W, less than or about 350 W, less than or about 300 W, less than or about 250 W, less than or about 200 W, less than or about 150 W, less than or about 100 W, less than or about 50 W, or less. By performing a low power purge process, removal of the deposited material may be maintained at less than or about 1 nm, or less, and may be maintained at a few monolayers of material, or less. This may be sufficient to remove particles from the surface, which may have lower attraction or bonding energy to the film, and may be readily volatized and removed, resolving defects on the film, while maintaining the formed film. Additionally, by performing a lower power treatment with an oxidizing material, surface attraction along the deposited material may be adjusted. For example, oxygen and many other species may be negatively charged, and may cause the surface to become electronegative. This may provide a repulsive force to particles afloat in the processing region, and may ensure the particles may be purged from the system instead of landing on the substrate.

Additionally, the surface energy of the substrate may be tuned to be more hydrophilic or hydrophobic in some embodiments, which may not only provide repulsion as noted above, but may also impact adhesion of later deposited films. For example, in some embodiments, subsequent processing operations may include depositing one or more other materials on the substrate. If the substrate surface may attract the material subsequently deposited, no other adjustments may be needed. Additionally, if a treated surface may repel the subsequently produced film, this can reduce adhesion and cause film peeling. Accordingly, in some embodiments, after a sufficient purge, which may reduce particle defects on the substrate, a separate treatment may be performed to adjust the surface energy on the substrate. For example, a hydrogen-containing material or plasma effluents may be delivered to interact with the surface, which may adjust the surface energy and improve adhesion properties with later-formed films. A number of other treatments may include use of the precursors utilized in the plasma purge, and may include selecting materials for the plasma purge based on an effect on film surface energy change. For example, a films surface energy, and specifically the solid surface free energy from Young's equation, may be increased or decreased depending on the material utilized. As one example, a nitrogen treatment may be performed to slightly increase the films surface energy to promote adhesion compatibility. In greater increases may be needed, a more electronegative material may be used. For example, nitrous oxide may be used in the plasma purge to produce an increased surface energy change, and oxygen may be used in the plasma purge to produce an even larger surface energy change. These treatments may respectively increase the number of electronegative materials contacting the film surface, which can increasingly impact the film surface energy. Additionally, materials may be used to reduce the film surface energy. For example, a fluorine-containing material may be used to reduce the film surface energy prior to a subsequent process.

As explained above, exposure to oxidizing materials may cause etching to occur in some embodiments if the process is not sufficiently controlled. This can lead to pitting or other issues with the produced film. Accordingly, in some embodiments, plasma purge operations according to embodiments of the present technology may be performed for less than or about 30 seconds of plasma generation or exposure to oxidizing species, and may be performed for less than or about 25 seconds, less than or about 20 seconds, less than or about 15 seconds, less than or about 10 seconds, less than or about 5 seconds, or less. Similarly, by limiting the amount of oxidizing material, the process may ensure limited etching, while allowing gas phase reactions to occur that can limit particle generation and defect formation. For example, to ensure limited etching of the formed film, the oxidizing material may be delivered at a flow rate of less than or about 250 sccm, and may be delivered at less than or about 200 sccm, less than or about 150 sccm, less than or about 100 sccm, less than or about 50 sccm, or less.

A plasma process may not be necessary in some embodiments, depending on the film produced, and instead a purge and soak operation may be performed, where a non-plasma-enhanced oxidizing material is flowed into the processing region and allowed to interact with the substrate, which may also capture radical effluent deposition species, and adjust surface charge on the deposited materials. By performing purge treatments according to some embodiments of the present technology, defect generation can be greatly reduced.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising:
    forming a plasma of a carbon-containing precursor in a processing region of a semiconductor processing chamber;
    depositing a carbon-containing material on a substrate housed in the processing region of the semiconductor processing chamber;
    halting a flow of the carbon-containing precursor into the processing region of the semiconductor processing chamber;
    contacting the carbon-containing material with an oxidizing material in the semiconductor processing chamber; and
    treating a surface of the carbon-containing material.

2. The method of semiconductor processing of claim 1, wherein treating the surface of the carbon-containing material comprises:
    forming a plasma of the oxidizing material in the processing region of the semiconductor processing chamber;
    contacting the carbon-containing material with plasma effluents of the oxidizing material; and forming volatile materials from a surface of the carbon-containing material.

3. A method of semiconductor processing comprising:
forming a plasma of one or more deposition precursors in a processing region of a semiconductor processing chamber;
depositing a material on a substrate housed in the processing region of the semiconductor processing chamber;
halting a flow of at least one of the one or more deposition precursors into the processing region of the semiconductor processing chamber;
contacting the material deposited on the substrate with plasma effluents of an oxidizing material; and
forming volatile materials from a surface of the material deposited on the substrate.

4. The method of semiconductor processing of claim 3, wherein the material deposited on the substrate comprises one or more of amorphous carbon, doped carbon, or a silicon-containing material.

5. The method of semiconductor processing of claim 3, wherein the oxidizing material comprises an oxygen-containing precursor or a fluorine-containing precursor.

6. The method of semiconductor processing of claim 3, wherein the plasma effluents of the oxidizing material are formed in the processing region of the semiconductor processing chamber, and wherein the plasma effluents are generated at a plasma power of less than or about 500 W.

7. The method of semiconductor processing of claim 3, wherein contacting the material deposited on the substrate with plasma effluents of the oxidizing material causes a surface of the material deposited on the substrate to become negatively charged.

8. The method of semiconductor processing of claim 3, wherein contacting the material deposited on the substrate with plasma effluents of the oxidizing material is performed for less than or about 30 seconds.

9. The method of semiconductor processing of claim 3, wherein a carrier gas is included as one of the one or more deposition precursors, wherein a flow of the carrier gas is maintained while contacting the material deposited on the substrate with plasma effluents of the oxidizing material, and wherein a plasma is sustained between depositing the material on the substrate and contacting the material with plasma effluents of the oxidizing material.

10. A method of semiconductor processing comprising:
forming a plasma of a carbon-containing precursor in a processing region of a semiconductor processing chamber;
depositing a carbon-containing material on a substrate housed in the processing region of the semiconductor processing chamber;
halting a flow of the carbon-containing precursor into the processing region of the semiconductor processing chamber;
contacting the carbon-containing material with plasma effluents of an oxidizing material; and
forming volatile materials from a surface of the carbon-containing material.

11. The method of semiconductor processing of claim 10, wherein the oxidizing material comprises an oxygen-containing precursor or a fluorine-containing precursor.

12. The method of semiconductor processing of claim 10, wherein the plasma effluents of the oxidizing material are formed in a remote plasma unit fluidly coupled with the processing region of the semiconductor processing chamber.

13. The method of semiconductor processing of claim 10, wherein a temperature of the semiconductor processing chamber is maintained at greater than or about 400° C. during the method.

14. The method of semiconductor processing of claim 10, wherein contacting the carbon-containing material with plasma effluents of the oxidizing material causes a surface of the carbon-containing material to become negatively charged.

15. The method of semiconductor processing of claim 10, wherein contacting the carbon-containing material with plasma effluents of the oxidizing material is performed for less than or about 30 seconds.

16. The method of semiconductor processing of claim 10, wherein contacting the carbon-containing material with plasma effluents of the oxidizing material is performed in the semiconductor processing chamber directly subsequent to the carbon-containing material being deposited on the substrate.

17. The method of semiconductor processing of claim 10, wherein the plasma effluents of the oxidizing material are formed in the processing region of the semiconductor processing chamber.

18. The method of semiconductor processing of claim 17, wherein the plasma effluents are generated at a plasma power of less than or about 200 W.

19. The method of semiconductor processing of claim 10, wherein a carrier gas is flowed with the carbon-containing precursor, and wherein a flow of the carrier gas is maintained while contacting the carbon-containing material with plasma effluents of the oxidizing material.

20. The method of semiconductor processing of claim 19, wherein a plasma is sustained between depositing the carbon-containing material and contacting the carbon-containing material with plasma effluents of the oxidizing material.

* * * * *